United States Patent [19]
Chen et al.

[11] Patent Number: 5,647,626
[45] Date of Patent: Jul. 15, 1997

[54] WAFER PICKUP SYSTEM

[75] Inventors: Chien-Feng Chen, Pei-Twun; Jun-Sheng Hsu, Taipei; Shih-Ming Pan, Ping Jen; Knight-Tian Ou, Miao-Li, all of Taiwan

[73] Assignee: Taiwan Semiconductor Manufacturing Company, Ltd., Hsin-Chu, Taiwan

[21] Appl. No.: 566,804

[22] Filed: Dec. 4, 1995

[51] Int. Cl.$^6$ .................................................... B65G 49/07
[52] U.S. Cl. ........................ 294/87.1; 294/1.1; 414/937
[58] Field of Search ............................. 294/1.1, 16, 32, 294/64.1, 64.3, 87.1, 103.1, 119.1; 414/935–939, 941; 901/30, 31, 40

[56] References Cited

U.S. PATENT DOCUMENTS

| | | | |
|---|---|---|---|
| 4,037,830 | 7/1977 | Poluzzi et al. | 269/21 |
| 4,620,738 | 11/1986 | Schwartz et al. | 294/64.1 |
| 4,744,709 | 5/1988 | Hertel et al. | 414/937 X |
| 4,867,631 | 9/1989 | Warenback et al. | 414/937 X |
| 5,195,729 | 3/1993 | Thomas et al. | 269/21 |
| 5,380,137 | 1/1995 | Wada | 414/937 X |
| 5,556,147 | 9/1996 | Somekh | 294/64.1 |

FOREIGN PATENT DOCUMENTS

| | | | |
|---|---|---|---|
| 661331 | 3/1994 | Japan | 414/937 |
| 6-127621 | 5/1994 | Japan | 414/941 |

*Primary Examiner*—John D. Cherry
*Attorney, Agent, or Firm*—George O. Saile; Wolmar J. Stoffel

[57] ABSTRACT

A non-vacuum semiconductor pick-up and transfer apparatus for handling semiconductor wafers. A flat tapered blade, with front and rear arcuate abutment surfaces adapted to hold a wafer, is provided. In use the blade is thrust between spaced wafers supported in a holder, lifted to retain the wafer between the abutment surfaces, and removed from the holder. The thin and tapered blade shape minimizes damage to the associated wafers in the event of a misalignment of the blade with the wafers.

10 Claims, 3 Drawing Sheets

WAFER PICKUP SYSTEM

BACKGROUND OF THE INVENTION

1) Field of the Invention

The present invention relates in general to devices used to lift and transport semiconductor substrates and more particularly to wafer handling systems.

2) Description of the Prior Art

Semiconductor manufacturers have a need to lift and transport thin, fragile semiconductor wafers over short distances, for instance, from a storage container to processing equipment. Tweezers are often used for this purpose, although tweezers can scratch and damage the fragile wafer surfaces. Sophisticated vacuum wands are also in use; such vacuum wands, must typically be connected to a central source of vacuum and include a form of trigger or valve for selectively coupling the vacuum to the tip of the tool.

Semiconductor wafers are often stored and processed standing upright next to other wafers in a row in a wafer cassette of some type. The wafers are normally facing in one direction so that the device side done wafer faces the backside of the adjacent wafer. Often the spacing between wafers is tight so that many wafers may fit into a small carrier box or into a processing reactor or furnace. The spacing between wafers can be between about 3 to 7 mm and typically can be about 4.76 mm.

Wafers are moved with a vacuum pencil by inserting the vacuum pencil between two wafers and contacting the tip of the vacuum pencil to the backside of a wafer. The vacuum holds the wafer on to the tip and the wafer is lifted out.

Current vacuum pencils create several problems when used to move wafers, especially wafers that are closely stacked together. One problem is that the device sides of wafers are often scratched when the vacuum pencil is inserted between two wafers. Wafers are positioned in wafer boats so that the device side of one wafer faces the back side of the wafer in front of it. To use a vacuum pencil to pick up a wafer, the operator inserts the vacuum pencil tip between two wafers to contact the back side of the selected wafer. However, the operator often touches the vacuum pencil tip to the device side of an adjacent wafer. This often occurs when an operator accidentally inserts the vacuum pencil tip too far down past the edge of the wafer. When the tip is overextended too far past the wafer edge, a small change in the vacuum pencil position will cause the tip to move against the device side.

Carriers are known and used to support and carry semiconductor wafers during handling and processing wafers. U.S. Pat. Nos. 4,037,830 and 5,195,729 describe such carriers. The disadvantage of these carriers is that they are expensive and require additional space in the processing equipment which reduces the capacity of the processing equipment.

There is a need in the industry for a simple and efficient wafer handling apparatus that eliminates or drastically reduces damage to the wafers during handling.

SUMMARY OF THE INVENTION

It is a primary object of the present invention to provide a simple, efficient, and inexpensive wafer handling apparatus for handling and transferring semiconductor wafers between vertical cassettes and other vertical wafer holding and storage units.

It is a further object of the present invention to provide a non-vacuum wafer handling apparatus that is capable of handling closely spaced wafers, while minimizing or eliminating damage to the wafers.

It is a still further object of the present invention to provide an apparatus capable of inserting and removing a plurality of closely spaced wafers into and out of a cassette or rack where the wafers are stored in vertical tiers.

It is yet another object of the present invention is to eliminate damage to wafers during handling.

In accordance with the aforementioned objects there is provided a semiconductor wafer pickup and transfer fork having a blade support that supports at least one, but usually a plurality of elongated flat tapered wafer support blades in spaced parallel relationship. The wafer support blades have a first arcuate wafer abutment at the wide end of the blade and a second arcuate wafer abutment at the narrow end of the support blades. The abutments are spaced to receive and hold a circular wafer on the blade. Narrow wafer edge support surfaces are provided to support the wafer adjacent the edge so that there is no contact between the lower wafer surface and support blade.

BRIEF DESCRIPTION OF THE DRAWINGS

The features and advantages of a wafer pickup and transfer fork according to the present invention will be more clearly understood from the following description taken in conjunction with the accompanying drawings in which like reference numerals designate similar or corresponding elements, regions and portions and in which:

FIG. 6 is an elevational view of a plurality of stacked wafers as supported in a cassette, and a correctly inserted plurality of wafer support blades inserted between.

DETAILED DESCRIPTION OF THE PREFERRED EMBODIMENTS

Figure 1:
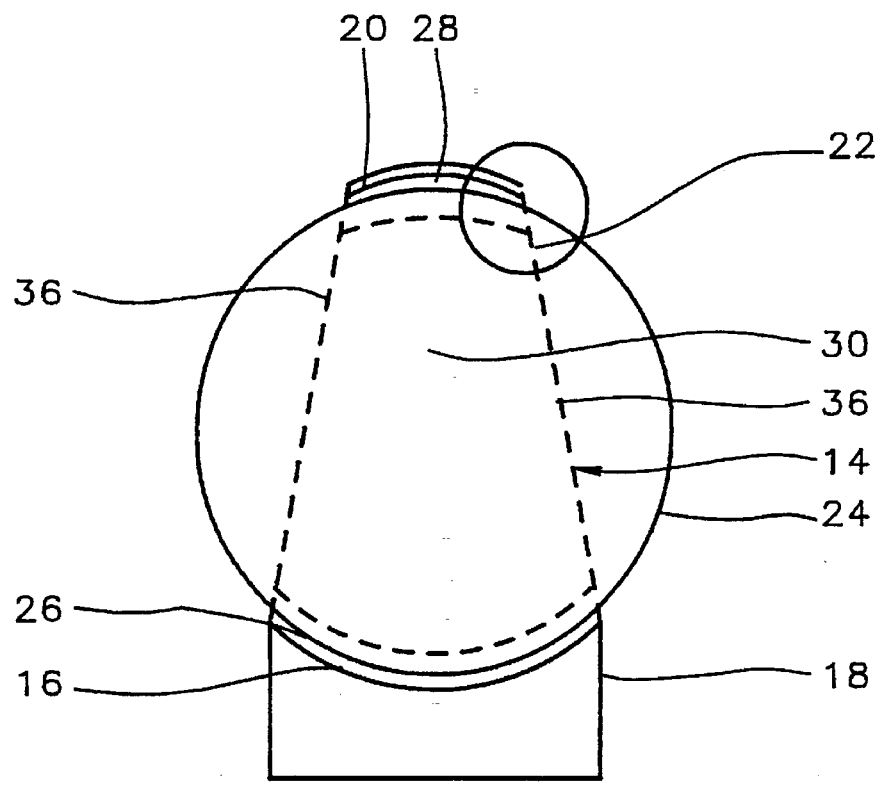
FIG. 1 is a top view of a support blade of the invention, with a wafer supported thereon.
Figure 2:
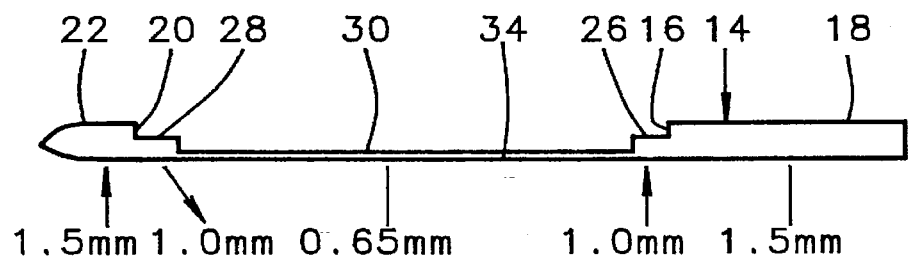
FIG. 2 is a side elevational view of the support blade.
Figure 3:
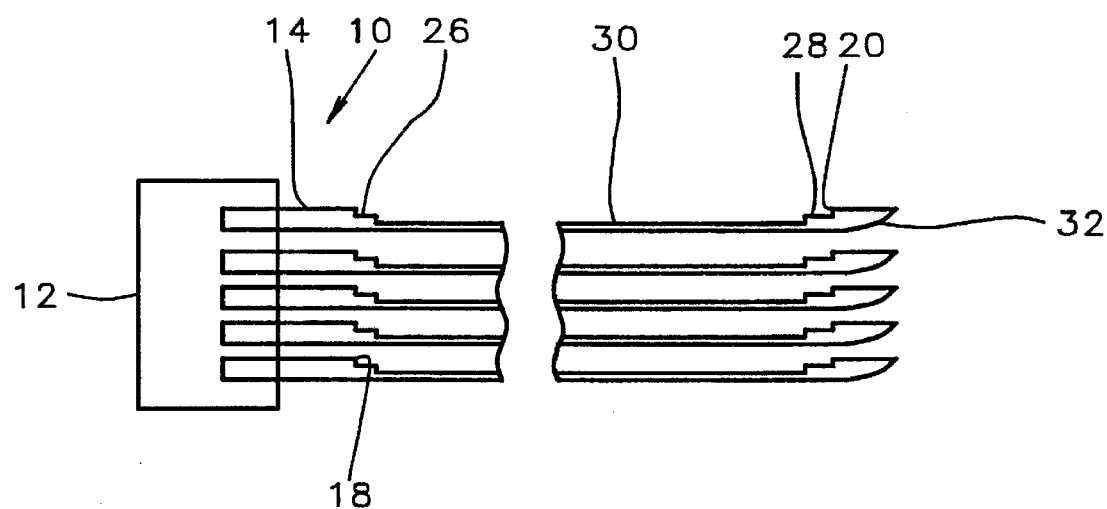
FIG. 3 is a side view of the blade support with a plurality of wafer support blades mounted thereon.

Referring now to FIGS. 1–3 them is depicted the semiconductor wafer pickup and transfer fork 10. As shown in FIG. 3, the fork 10 has a blade support 12 that has a plurality of elongated, flat, tapered wafer support blades 14 mounted thereon. As best illustrated in FIG. 1, each blade 14 has a first arcuate wafer abutment 16 on the wide end 18 of the blade, and a second arcuate wafer abutment 20 on the opposite narrow end 22 of the blade 14. A semiconductor wafer 24 is shown, in FIG. 1, supported on blade 18, between arcuate abutments 16 and 20. Adjacent abutment 16 there is provided a first narrow flat wafer edge support surface 26, and a second flat wafer edge support surface 28 is located adjacent abutment 20. The blade 14 has a depressed surface 30, between edge support surfaces 26 and 28, that prevents the bottom of wafer 24 from contacting the blade 14. This depressed surface 30 is best illustrated in FIGS. 2 and 3.

Figure 1A:
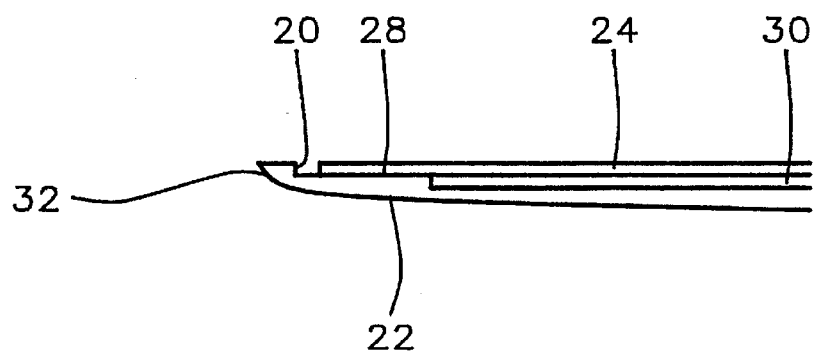
FIG. 1A is a detail side view, in enlarged scale, of the tip of the support blade.

As illustrated in FIG. 1A, the narrow leading end 22 of each support blade 18 has an upwardly curved surface 32. The bottom surface 34 of blade 14 is preferably flat. Also, the edges on the bottom surface on the tapered sides 36 are also rounded, as will be explained later. The blades 14 are mounted in blade support element 12 by any suitable method. Blades 14 are made of any suitable material that has the necessary strength and can be machined or molded. Preferably, blades 14 are made of $Al_2O_3$. The thickness of blades 14, at the thickest point, i.e. near the blade support 12, is approximately 1.5 mm. If the wafer diameter is increased, or decreased, the dimensions of the wafer support blade can be adjusted without exercise of invention. The taper of blade 14 can be varied. The preferred structural dimensions for a blade support adapted to handle a wafer having a diameter of 150 mm are shown in FIG. 2. The most preferable taper is obtained by providing a blade width at the wide end 18 that is approximately double the width at narrow end 22. For use with a wafer with a diameter of 150 mm, the width should preferably be on the order of 68 mm. The blade support 12 can be provided with a suitable handle (nor shown) adapting it for manual use, or with a suitable clamp or shape (not shown) for use on an automated robot.

Figure 4:
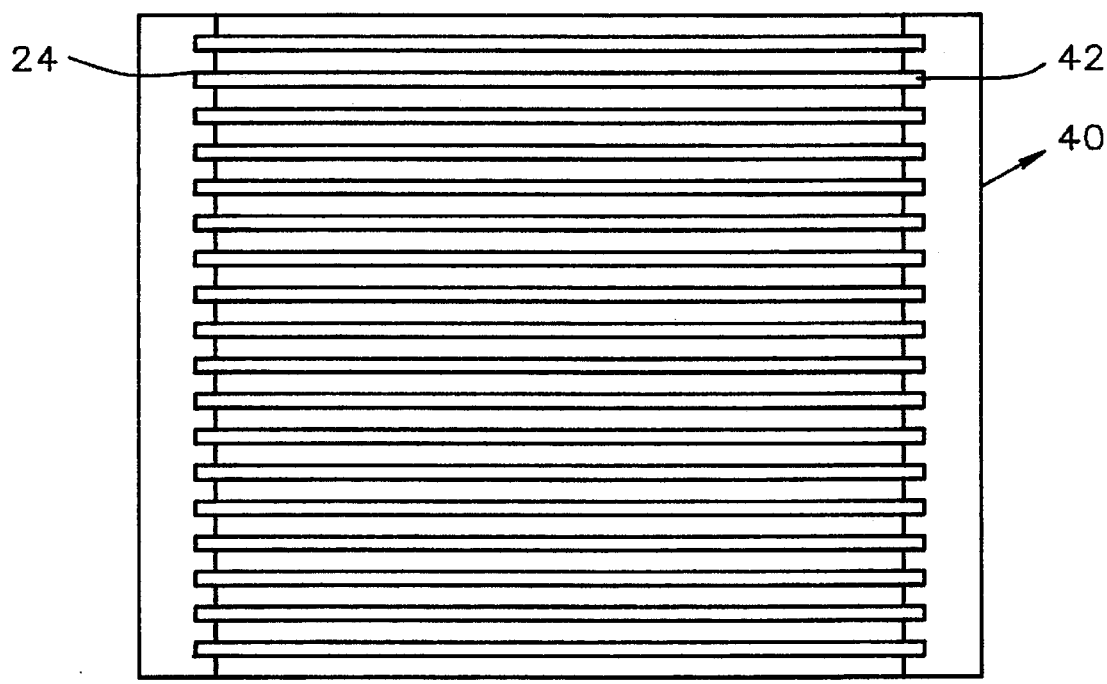
FIG. 4 is an elevational view of a vertical cassette holding a plurality of closely spaced wafers.

Referring now to FIG. 4, there is illustrated a typical vertical cassette or boat which can be loaded or unloaded with the transfer fork 10 of the invention. As shown, wafers 24 are maintained in cassette 40 in spaced, vertical stacked relation. The wafers are held in place because the wafer edges are seated in grooves 42 on the inside surfaces of cassette 40. Preferably, the wafer edges are seated in arcuate shaped grooves that contact the wafer on a portion of the circumference, but leave a space on the opposite wall for the leading edge of blades 14 to go past the edge surface. In use, the support blades of fork 10 are inserted between the wafers 24 without touching the wafers, and then lifted a small distance so that the wafer is supported on surfaces 26 and 28, between abutment surfaces 16 and 20. Then the fork 10 and wafers 24 are withdrawn from cassette 40 and deposited in another vertical cassette or boat, using the reverse order of steps.

Figure 6:
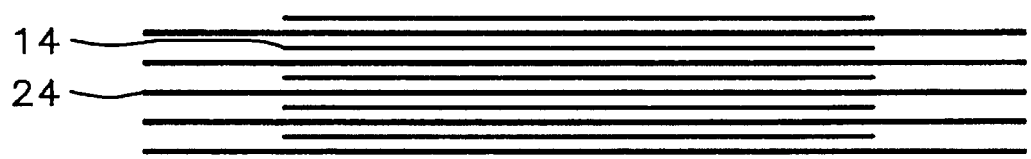
Figure 7:
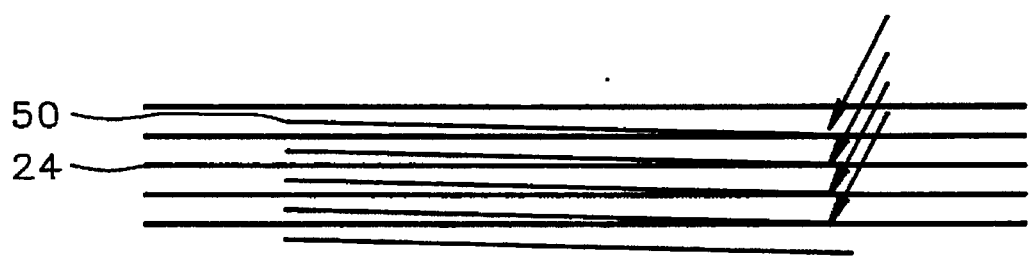
FIG. 7 is an elevational view of a plurality of stacked wafers with a plurality of support blades that are misaligned with respect to the wafers

If the fork and blades are inserted and withdrawn correctly, as shown in FIG. 6, the wafers suffer no damage. However, since the space between the wafers is small, on the order of 4.76 mm, and the length of the blades is greater than the diameter of the wafer, i.e. 150 mm, the probability of contact between the blade and the wafers is high, as shown in FIG. 7. Any prolonged sliding contact, particularly with a sharp edge, on the wafer, will result in a scratch on the surface of the wafer. The more prolonged the contact, the greater the damage because the initial contact will produce silicon particles which become a loose abrasive.

Figure 5:
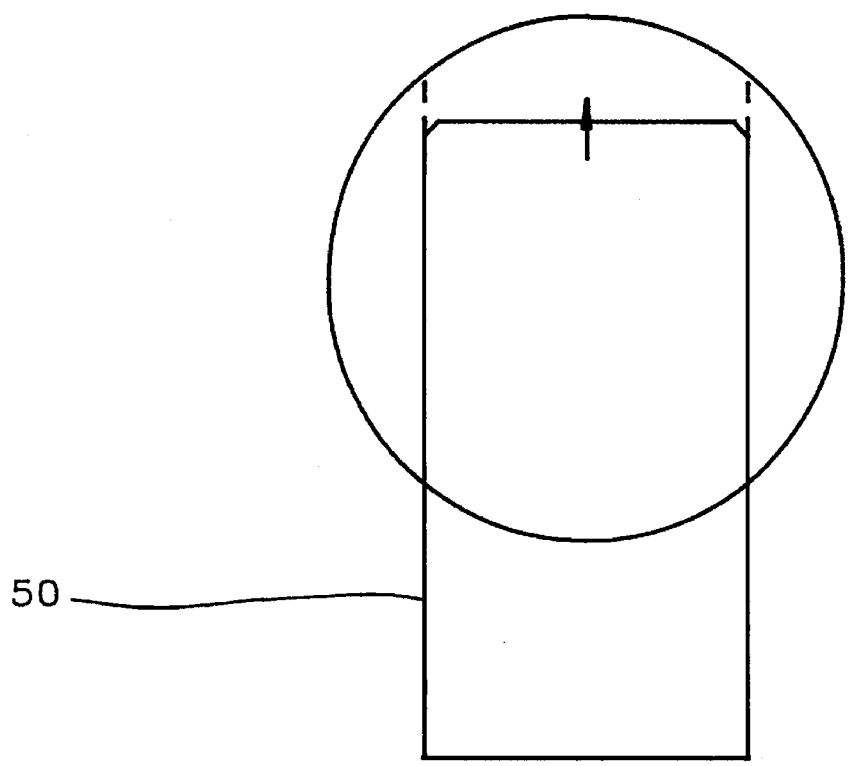
FIG. 5 is a top view of a wafer and a wafer support blade that is rectangular in shape.

For comparison purposes, a rectangular blade 50 with a width of 68 mm is shown moving across wafer 24, in FIG. 5. The tilt tolerance $\emptyset = \sin^{-1}(4.76/68) = \sim 4.01$ degrees, where the wafer spacing is 4.76 mm. At this tilt, one edge of blade 50 will contact the bottom surface of the upper wafer, and the opposite edge will contact the upper surface of the lower wafer. When the edges of the blade 50 are parallel, as depicted in FIG. 5, the contact is a prolonged sliding contact along a line, which is very likely to damage the upper surface of the lower wafer. If the blade 14 of the invention is used in the same situation, the tilt tolerance is $\emptyset = \sin^{-1}(4.76/34) = \sim 8.05$ degrees, where the width of the leading edge of the blade is 34 mm, and the wafer spacing is 4.76 mm. The tilt tolerance angle for the fork of the invention is about double the fork illustrated in FIG. 5, with a rectangular blade. In addition, when contact is made between a wafer and applicants' tapered blades, the contact is constantly shifted outwardly, thereby avoiding a prolonged sliding contact along a line. Applicants shifting contact, when made, will result in a great deal less, if not any, damage to the wafer. The rounded surface 32 on the leading edge of the blade will also prevent scratching the wafer if it is inadvertently allowed to coma and move across the wafer.

While the invention has been particularly shown and described with reference to the preferred embodiments thereof, it will be understood by those skilled in the art that various changes in form and detail may be made therein without departing from the spirit and scope of the invention.

What is claimed is:

1. A semiconductor wafer pickup and transfer fork comprising, a blade support, a plurality of elongated flat, tapered wafer support blades mounted on said blade support in spaced, parallel relation, said tapered support blades each having tapered side edges, a wide end and a leading narrow end with an arcuate shape, with said wide end mounted in said blade support, each of said support blades provided with an upwardly curved lower surface on the said leading narrow end, each of said support blades provided with a wafer holding means on the upper surface adapted to support and hold a circular semiconductor wafer thereon, said wafer holding means including a first arcuate wafer abutment on said wide end adjacent said blade support, and a second arcuate wafer abutment on said narrow end, said wafer holding means further including a first arcuate narrow wafer edge support surface adjacent said first arcuate wafer abutment and a second arcuate wafer edge support surface adjacent said second arcuate wafer abutment.

2. The semiconductor pickup and transfer fork of claim 1 wherein the width of said narrow end of said wafer support blade is approximately one half the width at said wide end.

3. The semiconductor pickup and transfer fork of claim 2 wherein a depressed surface area is provided on said upper surface of each of said wafer support blades between said first arcuate wafer edge support surfaces and said second wafer edge support surfaces.

4. The semiconductor pickup and transfer fork of claim 3 wherein said first arcuate abutment and said second arcuate abutment of said support blades are spaced to accept and hold a semiconductor wafer having a diameter of 150 mm.

5. The semiconductor pickup and transfer fork of claim 4 wherein at least 5 wafer support blades are mounted in vertical alignment on said blade support.

6. The semiconductor pickup and transfer fork of claim 5 wherein the vertical center to center spacing of said wafer support blades is on the order of 4.76 mm.

7. The semiconductor pickup and transfer fork of claim 2 wherein the thickness of said wafer support blades at said wide end is approximately 1.5 mm.

8. The semiconductor pickup and transfer fork of claim 1 in combination with an automated robot apparatus.

9. The semiconductor pickup and transfer fork of claim 1 wherein said wafer support blades are formed of $Al_2O_3$.

10. The semiconductor pickup and transfer fork of claim 1, wherein said tapered side edges are rounded.

* * * * *